US010848404B2

(12) United States Patent
Mei

(10) Patent No.: US 10,848,404 B2
(45) Date of Patent: Nov. 24, 2020

(54) LAN CABLE CONDUCTOR ENERGY MEASUREMENT, MONITORING AND MANAGEMENT SYSTEM

(71) Applicant: Richard Mei, Parker, TX (US)

(72) Inventor: Richard Mei, Parker, TX (US)

(*) Notice: Subject to any disclaimer, the term of this patent is extended or adjusted under 35 U.S.C. 154(b) by 41 days.

(21) Appl. No.: 16/161,293

(22) Filed: Oct. 16, 2018

(65) Prior Publication Data

US 2019/0116104 A1 Apr. 18, 2019

Related U.S. Application Data

(60) Provisional application No. 62/572,866, filed on Oct. 16, 2017.

(51) Int. Cl.
*H04L 12/26* (2006.01)
*H04L 12/24* (2006.01)
*G01R 31/58* (2020.01)

(52) U.S. Cl.
CPC .............. *H04L 43/08* (2013.01); *G01R 31/58* (2020.01); *H04L 41/0672* (2013.01); *H04L 43/14* (2013.01); *H04L 43/16* (2013.01); *H04L 43/50* (2013.01); *H04L 43/10* (2013.01)

(58) Field of Classification Search
CPC ......... H04L 43/08; H04L 43/14; H04L 43/16; H04L 43/50; H04L 43/10; H04L 41/0672; G01R 31/58
USPC ....................................................... 709/224
See application file for complete search history.

(56) References Cited

U.S. PATENT DOCUMENTS

| | | |
|---|---|---|
| 4,878,226 A | 10/1989 | McQuoid et al. |
| 6,871,156 B2 | 3/2005 | Wallace et al. |
| 7,978,845 B2 | 7/2011 | Caveney et al. |
| 8,145,814 B2 | 3/2012 | Diab et al. |
| 8,578,067 B2 | 11/2013 | Diab |
| 8,719,205 B2 | 5/2014 | Doorhy et al. |
| 8,731,405 B2 | 5/2014 | Renfro, Jr. et al. |
| 8,843,678 B2 | 9/2014 | Diab et al. |
| 8,924,616 B2 | 12/2014 | Diab |
| 2005/0089027 A1 | 4/2005 | Colton |
| 2007/0296391 A1 | 12/2007 | Bertin et al. |
| 2008/0238634 A1 | 10/2008 | Diab et al. |
| 2009/0097846 A1 | 4/2009 | Kozischek et al. |
| 2010/0318819 A1* | 12/2010 | Diab ............... G01K 13/00 713/300 |
| 2013/0022350 A1 | 1/2013 | Kozischek et al. |
| 2013/0201006 A1 | 8/2013 | Kummetz et al. |
| 2013/0234725 A1 | 9/2013 | Enge |

(Continued)

FOREIGN PATENT DOCUMENTS

CN 107687909 2/2018

*Primary Examiner* — Zi Ye
(74) *Attorney, Agent, or Firm* — QPatents

(57) ABSTRACT

A LAN cable conductor monitoring system includes an IoT device with a number of IoT input ports that are each connected to a network switch output port. The IoT device measures the current passing through each connected network switch output port, and passes the signals on to their respective cable conductors. A number of temperature sensors positioned at various points on the pass temperature readings back to the IoT device. If the temperature readings or current readings for a given network switch output port exceed predefined limits, the IoT device imposes PoE (Power over Ethernet) current constraints on the network switch.

22 Claims, 6 Drawing Sheets

(56) References Cited

U.S. PATENT DOCUMENTS

| | | | |
|---|---|---|---|
| 2015/0134954 A1* | 5/2015 | Walley | H04L 63/08 |
| | | | 713/168 |
| 2015/0222352 A1 | 8/2015 | Kewitsch | |
| 2016/0073482 A1 | 3/2016 | Fok et al. | |
| 2016/0128043 A1* | 5/2016 | Shuman | H04W 72/044 |
| | | | 370/331 |
| 2016/0218934 A1 | 7/2016 | Pierce et al. | |
| 2016/0381123 A1 | 12/2016 | Kanne et al. | |
| 2017/0034079 A1 | 2/2017 | Coffey | |
| 2017/0034597 A1 | 2/2017 | Shih | |
| 2017/0149634 A1 | 5/2017 | Bezold et al. | |
| 2017/0170314 A1 | 6/2017 | Verhulst et al. | |

\* cited by examiner

LAN CABLE CONDUCTOR ENERGY MEASUREMENT, MONITORING AND MANAGEMENT SYSTEM

CROSS-REFERENCE TO RELATED APPLICATIONS

The present application claims priority from, and incorporates by reference in its entirety, U.S. provisional patent application 62/572,866.

BACKGROUND

Field of the Invention

The present invention relates to telecommunications diagnostic and monitoring equipment, and more particularly, to apparatus and methods for measuring and monitoring local area network (LAN) cable conductors.

Description of Related Art

It is quite common for businesses or other organizations to have a wired network installed in their building or on their property to provide Internet access and link their wireless nodes, computers and sometimes even their printers. The network—for example, a LAN (local area network)—may entail a single server in a wiring closet or multiple server units in a server rack. The server(s) typically have a number of signal cables running from them that are routed throughout the premises. Historically, network cabling installers followed installation practices whereby they bundled a large number of cables together for ease of installation in running the cables above the ceiling (in the plenum).

Before the advent of Power over Ethernet (PoE) applications, the number of cables per bundle wasn't a concern. The network cables were primarily used to transmit data which didn't require significant amounts of current. This changed with the advent of PoE applications and desire to power networked devices using the network cable. The number of cables per bundle became a concern because supplying power to cable raises the temperature of the cable. When a problem with the network arises it can be difficult for a technician to arrive at the solution without some sort of data other than a complaint that the system has failed in a particular area.

SUMMARY

The present inventor recognized certain limitations in conventional diagnostic systems for PoE networks. Embodiments disclosed herein address the above stated needs by providing systems and methods for measuring and monitoring LAN cable conductors.

Various embodiments are drawn to a cable conductor monitoring system that includes an IoT device with a number of IoT input ports. The IoT device may be embodied as either an IoT panel or an IoT outlet. Each of the IoT input ports is connected to a network switch output port. The IoT panel includes a corresponding number of IoT output ports each connected to cable conductors of the network switch. The IoT panel is configured to make a current measurement on each of the signals from each of the network switch output ports. An Iot device embodied as an Iot outlet is also connected to a cable conductor from a network port.

Various embodiments include a number of temperature sensors distributed at different points along the cable conductors connected to either the IoT panel or an IoT outlet. The temperature sensors are configured to make local temperature readings on the cable conductors or the ambient environment where the cable conductors are installed. In the event the temperature readings or current readings for a given network switch output port exceed predefined limits, the IoT panel is configured to block certain port turn up requests from the network switch to increase of PoE power level for selected cable conductor(s), or in some instances, reduce the PoE levels of current on selected cable conductor(s). The cable conductor(s) selected to be subject to current limiting constraints may be based on a predetermined prioritization of the cable conductors.

Various embodiments also include a number of IoT outlets that are connected to the traditional patch panel or network switch via the cable conductors. The IoT outlets may be configured to make a current measurement on each cable conductor terminated with them or connected to them. An IoT outlet can block a corresponding port turn up request from the network switch to increase its PoE power level. The system includes a gateway connected to the IoT panel, the IoT outlet and the temperature sensor. The gateway provides Internet access to the various components of the system.

BRIEF DESCRIPTION OF THE DRAWINGS

The accompanying drawings, which are incorporated in and constitute part of the specification, illustrate various embodiments of the invention. Together with the general description, the following drawings serve to explain the principles of the invention.

DETAILED DESCRIPTION

Figure 1:
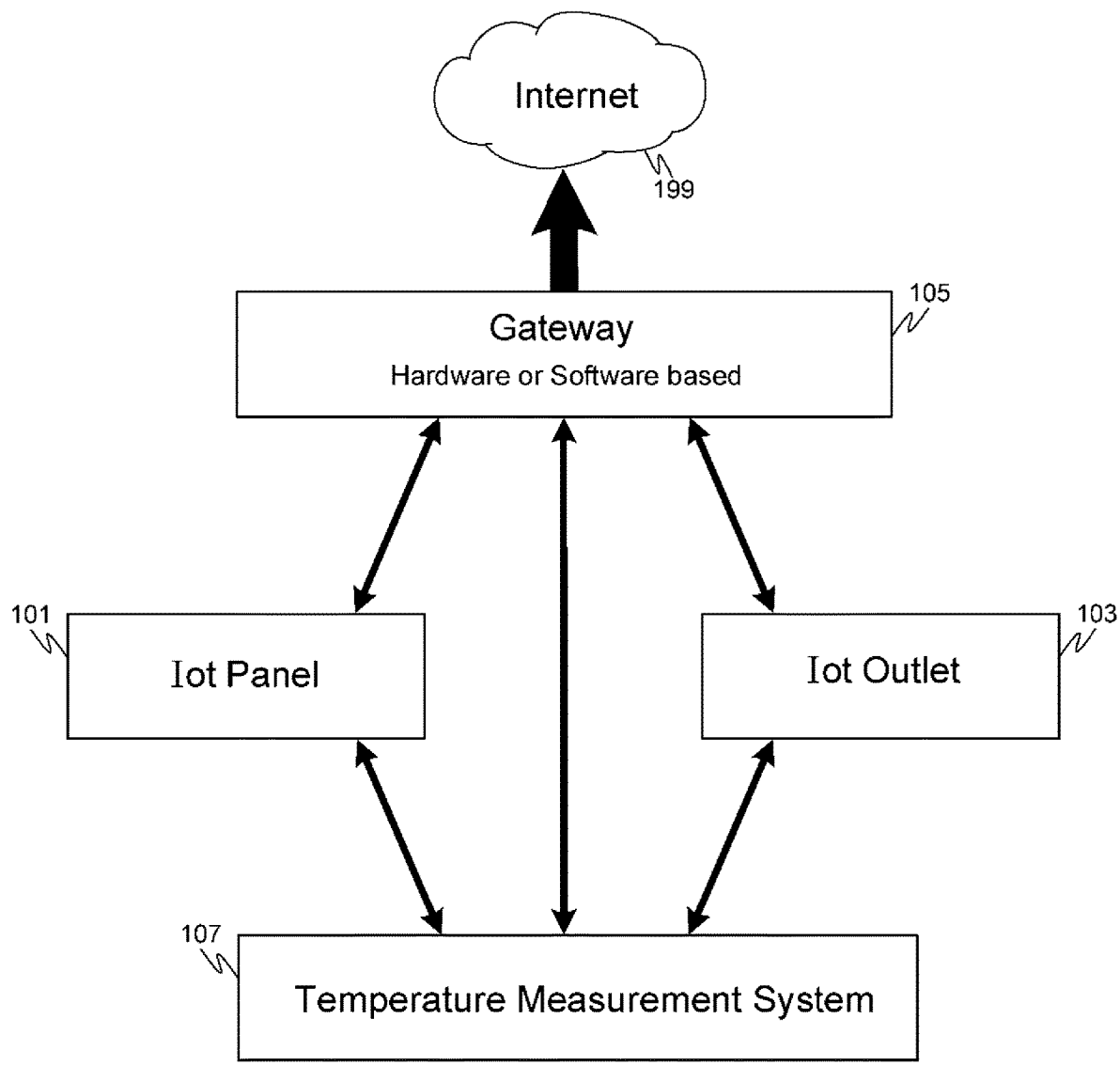
FIG. 1 is a block diagram of system components according to various embodiments.

FIG. 1 depicts embodiment 100 of the LAN cable monitoring system. The system is typically implemented in component parts using various numbers of four different component categories. The four categories of components include IoT panels 101, IoT outlets 103, gateways 105 and a temperature measurement system 107. The various component devices may either be configured to work independently or operate in conjunction with each other.

The IoT panel 101 is typically inserted in-line on the signal lines coming out of a network switch. IoT panel 101 receives communication signals from the network switch, monitors or measures the signals, and then passes the signals on down their respective network lines. For example, the IoT panel 101 is configured to make current measurements on the signals passing through it. The IoT panel 101 is described in further detail below, in conjunction with FIG. 3.

The IoT outlet 103 may be embodied as a telecommunications outlet, for example, an Ethernet wall plate RJ45 outlet. The IoT outlet 103 is configured to include circuitry capable of measuring current passing through one or more cable conductors and/or patch cord conductors connected to a port of outlet 103. Gateway 105 includes software and/or hardware that joins the IoT panels 101 and/or the IoT outlets 103 to other software systems, including for example, the Internet, data storage systems, Network Management Systems (NMS), building energy management systems, or the like. Various embodiments of gateway 105 have the capability to store measured current readings, measured temperature readings, other measured readings, and inputted data and/or parameters. Embodiments of gateway 105 are configured to perform analytics using data from IoT panels 101, IoT outlets 103 or other sources, and pass that information through wired and/or wireless communication networks to other software systems for decision analysis.

In various embodiments the temperature measurement system 107 includes a number of temperature sensors configured to take local temperature readings at multiple points along cable pathways. Various embodiments of the temperature measurement system 107 may also be configured to provide the data through wired and/or wireless communication networks, to the IoT panels 101, to the IoT outlets 103 and/or to the gateway 105. In various embodiments the temperature measurement system 107 also includes temperature sensors within the IoT outlets 103.

Figure 2:
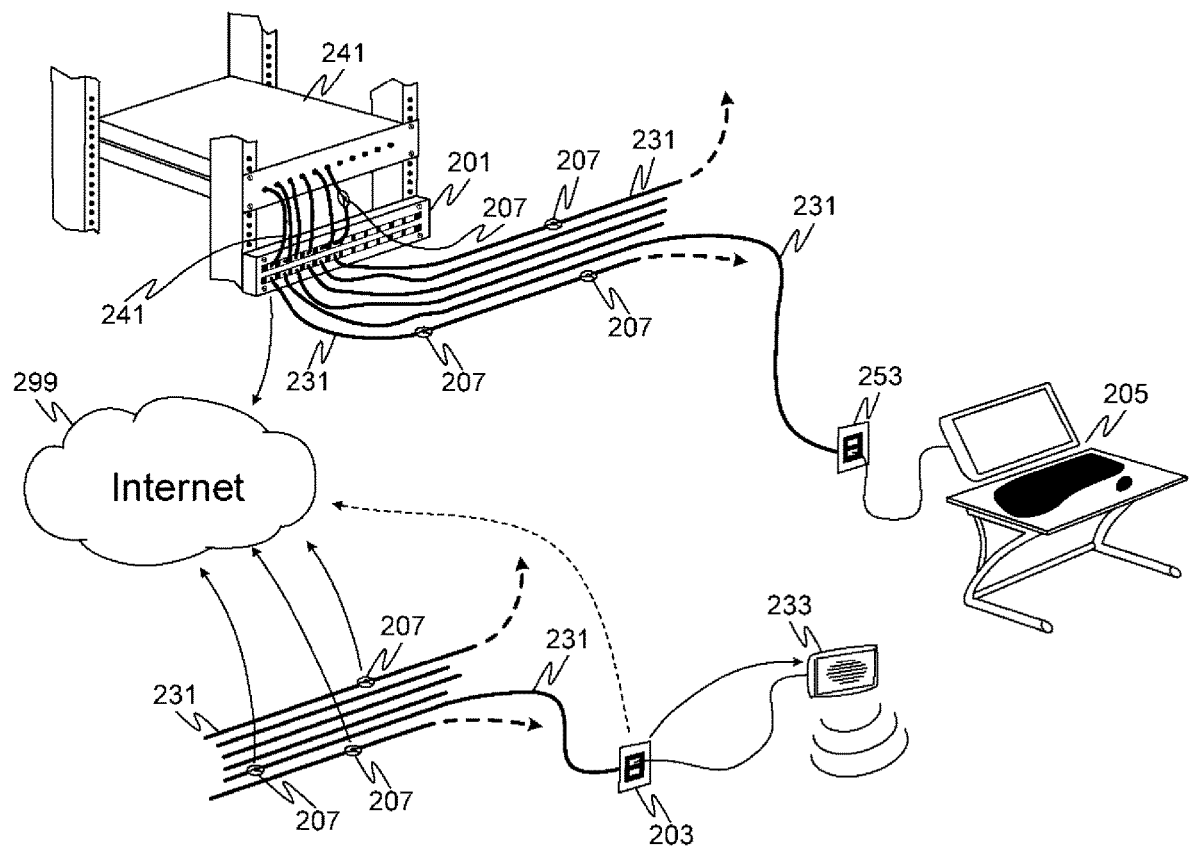
FIG. 2 depicts a typical interconnection of system components according to various embodiments.

FIG. 2 depicts a typical interconnection of system components according to various embodiments. The network switch 241 is often installed in a wiring closet of the building where the LAN system is set up. Various embodiments of the LAN cable monitoring system disclosed herein includes a gateway 205, temperature sensors 207 and IoT devices that may be embodied in the form of an IoT panel 201 (sometimes called an intelligent patch panel) or IoT outlets 203. The gateway 205 and IoT panels 201 or IoT outlets 203 may, in some embodiments, be communicatively coupled through wired and/or wireless network connections to enable them to communicate with each other. For example, these components may communicate with each other by being connected directly, may communicate via the Internet 299, or may communicated by either being connected to cable conductors 231 or connected to a wireless node 233 on the LAN.

The IoT panel 201 which serves as an IoT device is typically inserted in-line on the signal lines coming out of network switch 241. This may be done using jumper cables 241. The IoT panel 201 receives all signals sent from network switch 241, monitors or measures the current sent through the signal lines (or through unused lined dedicated to power transmission), and then passes the signals (and current) on down their respective network lines. In addition to the IoT panel 201 measuring the current on each cable conductor 231, the temperature sensors 207 measure local temperatures at various points within the network where they are installed. The term "local temperature" as that term is used herein means the temperature at a particular point, that is, at the location of the sensor. The temperature sensors 207 are typically installed directly on a cable so as to provide the most accurate local temperature reading for the cable. In some situations that is not possible due to proximity constraints. In such situations the temperature sensor 207 may be installed on a nearby cable bundle hangar, bracket, or other cable installation hardware, or on a wall, ceiling tile or other portion of the building.

The temperature may vary considerably at various points along cable conductor. The local temperature indicates the reading at a particular temperature sensor 207. The data from these measurements allows the system to calculate the temperature of cable bundles. If the temperature in a cable bundle nears or exceeds a predetermined limit, the IoT panel 201 or the IoT outlet 203 may be configured to "block" further requests to turn up (allow power to pass through) a new port associated with that cable bundle. If the cable bundle temperature exceeds a second, higher predetermined limit, the IoT panel 201 or the IoT outlet 203 may be configured to reduce the current passing through the cable bundle.

Data cables generally have a maximum cable temperature rating. If a cable in a bundle operates at or near its maximum temperature rating for prolonged periods, the electrical and mechanical performance of the cable will be negatively impacted and data signals will be attenuated. For bundled cables, the temperature issue may be exacerbated for cables that are closest to the middle of the bundle. Different segments along a run of bundled cables can experience different ambient temperatures which may influence the amount of power that can be supplied by the cables and the attenuation of the data being sent through the cables. According to TIA TSB-184, the maximum ambient temperature of 45° C. is presumed in conjunction with cabling with a maximum rating of 60° C., thus allowing a maximum temperature rise of 15° C. on any cable within the bundle due to dc powering.

TABLE 1

Maximum bundle size for 15° C. temperature rise at 45° C. ambient.

| | 26 AWG | | Category 5e | | Category 6 | | Category 6A | | Category 8 | |
|---|---|---|---|---|---|---|---|---|---|---|
| | Air | Conduit | Air | Conduit | Air | Conduit | Air | Conduit | Air | Conduit |
| 600 mA | 124 | 68 | 191 | 129 | 252 | 182 | 313 | 242 | 918 | 514 |
| 720 mA | 75 | 39 | 121 | 79 | 163 | 114 | 203 | 151 | 581 | 317 |
| 1000 mA | 28 | 13 | 51 | 31 | 72 | 46 | 90 | 62 | 243 | 125 |

In the latest draft of IEEE 802.3bt for PoE, Type 3 and Type 4 Power Source Equipment (PSEs) and Power Devices (PDs) will allow from 600 to 960 mA of current to be sent down each pair of conductors in the cable. If PDs start drawing 600 to 960 mA of current, and the ambient temperature of the plenum space is higher than 45° C., then the number of cables per bundle, as specified in the table above, should be reduced to avoid exceeding the temperature threshold. The 2017 National Electrical Code (NEC) has been revised to address the above problem. Code enforcement officials will need to make sure new construction conforms to the revisions, and over temperature situations do not occur. In the meantime some existing equipment installed according to previous guidelines may experience degradation or failures due to excessive cable temperatures.

The power for the gateway 205 is typically through the AC power system supplied on the premises. In some embodiments where the gateway 205 is implemented in module form the power may be PoE. Power for at least one of the IoT panels 201 in a network equipment rack is typically either AC or PoE. The remaining IoT panels 201 in the network equipment rack, if any, may be powered via a bus connection to the AC or by a PoE powered patch panel in that rack. In at least some embodiments the IoT (patch) panels 201 have a battery backup (e.g., with trickle charging) in the event power over the bus is lost. The battery backup power is designed to ensure operation of the blocking function even if the panel loses power.

The installer can program the IoT panels 201 with a port-to-bundle map that follows the cable installation designer's guidelines or as-built records. This programming may be performed with a smartphone app or other software user interface through a wired or wireless network connection. Communications between the IoT panels 201 and/or IoT outlets 203 and the gateway 205, if implemented, can be either wired or wireless. Communications between the gateway 205 and network switch 241 can be either wired (e.g., via conductor cables 231) or wireless (via wireless node 233). Communications between the gateway 205 and network switch 241 may be controlled using the switch management software.

The blocking function is typically set up to be automatic and not require intervention by a human being. The gateway 205 will typically be configured to notify the network switch 241 that a port turn-up was blocked by an IoT panel 201 or an IoT outlet 203 due to a potential over current or temperature situation. In most situations the blocking is set up to remain active until the current and temperature numbers are within the allowable limits. Once the current and temperature numbers are within the allowable limits, the patch panel port may be reset either mechanically or electronically.

The control parameters specifying control of the LAN cable monitoring system may be set up through the gateway 205 and/or by using a smartphone app or other software user interface coupled to an IoT panel 201 or an IoT outlet 203. The control parameters include a first predetermined temperature limit that, if exceeded, will result in PoE turn up requests to be denied. A parameter specifying a second, higher predetermined temperature limit will result in certain PoE current levels being reduced. Exceeding (or meeting) either the first or second temperature limit may affect PoE current levels on signal line other than the line where the temperature was detected.

Figure 3:
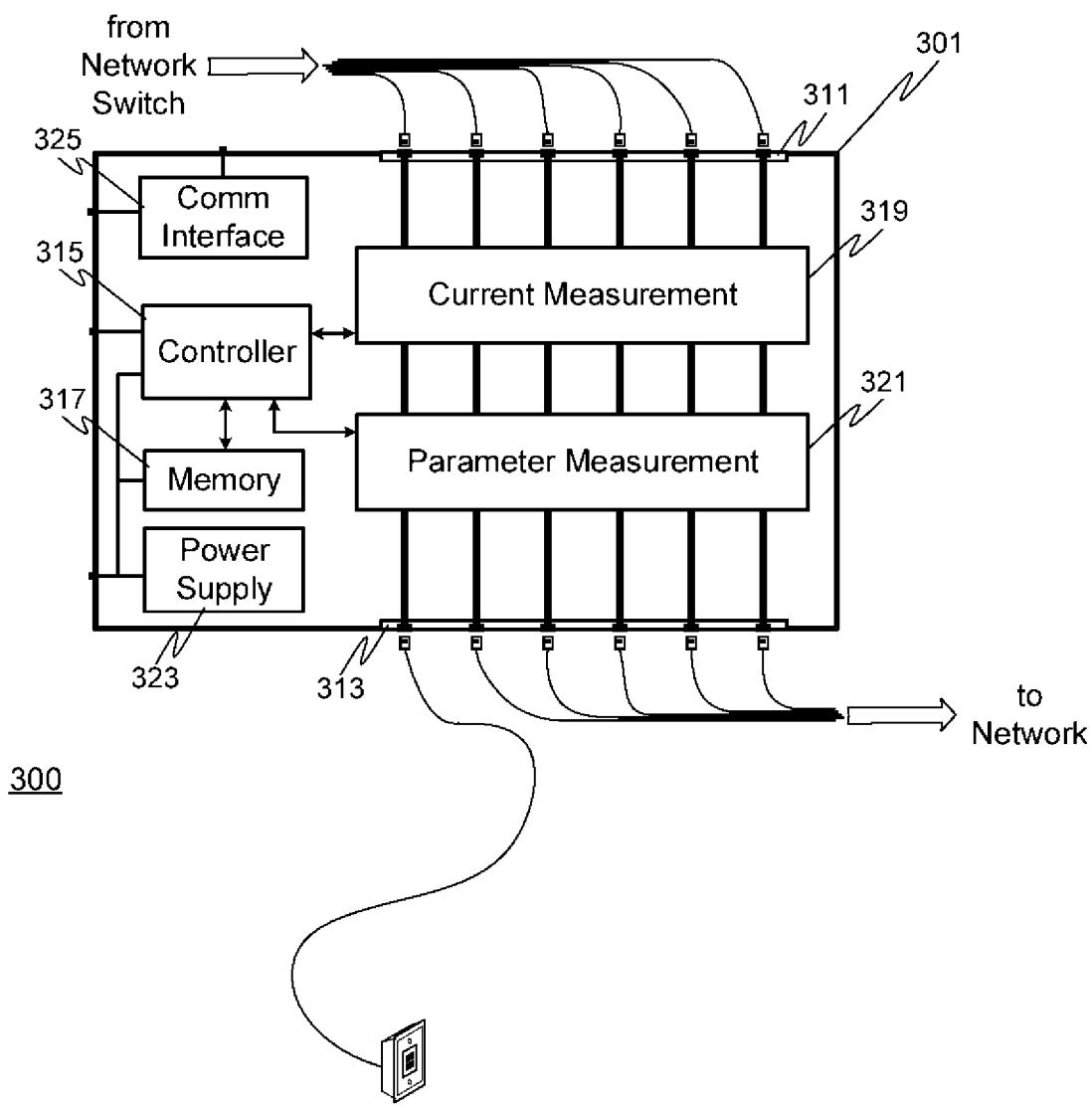
FIG. 3 is a block diagram of an Internet of Things (IoT) panel according to various embodiments.

FIG. 3 is a block diagram of an IoT panel 301 which corresponds to IoT panel 101 of FIG. 1. IoT panel 301, as an IoT device, is inserted in-line on the signal lines coming from a network switch such as network switch 241 of FIG. 2. IoT panel 301 is configured to pass through the data signals and current from the network switch. The IoT panel 301 takes current measurement readings on the signals. IoT panel 301 includes an input patch panel 311 with a number of IoT input ports configured to receive signals from a network switch. IoT panel 301 also includes output patch panel 313 with IoT output ports corresponding to the IoT input ports. Although the block diagram in FIG. 3 depicts the input patch panel 311 and the output patch panel 313 on opposite sides of the IoT panel 301, in practice the IoT input ports and the IoT output ports may be configured on the same patch panel or on two patch panels positioned near each other on the IoT panel 301.

The IoT input ports of the IoT panel 301 are connected to the network switch ports via cable conductors and/or patch cord conductors. Conventional network switches generally have either 12 ports or 24 ports. The various implementations of IoT panel 301 may be configured with any number of ports, but typically have either 12 or 24 input and output ports in order to correspond to conventional network switches. Alternatively, some embodiments of IoT panel 301 are configured with six input/output port pairs (or four input/output port pairs, three input/output port pairs, etc.), allowing two or more IoT panels 301 to be ganged together and used for a given conventional network switch, e.g., having either 12 or 24 ports.

The IoT panel 301 is configured with a current measurement unit 319 capable of making current measurements on the signals passing through it. Various embodiments of IoT panel 301 are configured with a controller 315 to control the current measurements. The IoT panel 301 may be implemented to continuously measure the current of the signals passing through it. The IoT panel 301 may also be configured to make periodic current measurements, or be programmed to make current measurements in predefined time intervals or at certain times of the day, for example, at times of expected high traffic (or at times of expected low traffic or no traffic). The current measurement circuitry of the IoT panel 301 is designed to minimally affect the signals themselves to the extent possible so as not to degrade the signals or possibly introduce errors or noise. Some embodiments of IoT panel 301 are configured with parameter measurement hardware 321 to take other parameter measurements, including, for example, voltage measurements, power measurements, temperature measurements, timing measurements or other such parameters for gauging the performance of the network switch as known to those of ordinary skill in the art.

Figure 5:
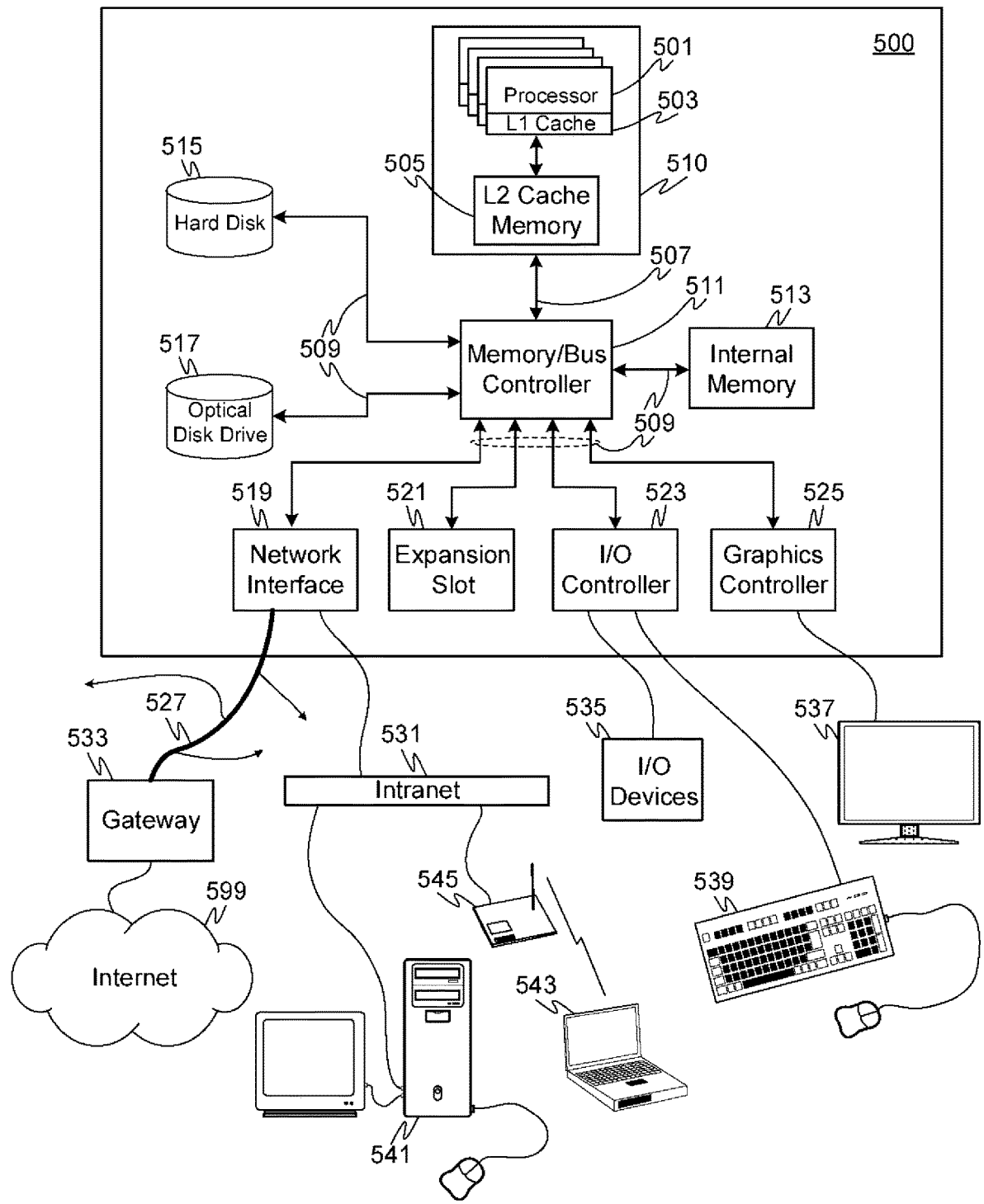
FIG. 5 depicts a computer system with components suitable for use in implementing the various embodiments disclosed herein.

In various embodiments the IoT panel 301 is implemented with the capability to store measured current readings, or other measured readings and inputted data. IoT panel 301 may be configured with memory 317 for storing the current readings or other data. Based upon the stored information, the IoT panel 301 can perform analytics and use the results of the analytics to make decisions and change the state (on/off) of the panel connector ports. The analytics can be performed under control of controller 315 or under control of a microprocessor or controller connected to IoT panel 301, e.g., a smart phone connected to IoT panel 301. Controller 301 and memory 317 may be implemented using a number of different types of microprocessors and/or storage media, including for example, the microprocessors and storage media described below for the general purpose computer depicted in FIG. 5.

In some embodiments the IoT panel 301 includes a power supply 323 to provide power to the other components of the IoT panel 301. The power supply 323 can also be configured to supply power to other IoT panels within the same rack or instrument bay, or otherwise positioned nearby. As such, not all IoT panels need to include a power supply—that is, IoT panels can share a common power supply 323.

In various embodiments the IoT panel 301 is designed to receive control signals and to provide access to information stored in it through wired and/or wireless communication networks. The IoT panel 301 can be connected to other IoT panels via a wired bus or wirelessly. In practice the functionality of the IoT panel 301 may be implemented wholly or piecemeal within the patch panel or network switch itself, the Ethernet switch port or module, or another assembly or module within the wiring closet. To facilitate communication of data and control signals the IoT panel 301 may be configured with a communication interface 325.

The system may include a number of IoT outlets such as IoT outlet 203 depicted in FIG. 2, which corresponds to IoT outlet 103 of FIG. 1. The IoT outlets 203 serve as IoT devices and may be designed with capabilities similar to the IoT panel 301 described above. IoT outlet 203 may be embodied as a telecommunications outlet configured to include circuitry capable of measuring current passing through its ports. IoT outlet 203 also has the capability to store measured current readings, measured temperature readings, or other measured readings and inputted data. Based upon the stored information, some embodiments of the IoT outlet 203 may be configured to perform analytics and use the results of the analytics to make decisions and change the state (on/off) of its outlet port and impose PoE current constraints on one or more cable connectors.

Some implementations of IoT outlet 203 may be powered and provide access to information stored in it through wired and/or wireless communication networks. The IoT outlet power source may be from the buildings electrical system (e.g., wired into an AC line) or may be a battery contained within the IoT outlet 203. The IoT outlet current measurement is, for the purposes of this disclosure, any current measurement that is performed by the system aside from the current measurement of the IoT panel—e.g., any current measurement performed outside the wiring closet.

Figure 4A:
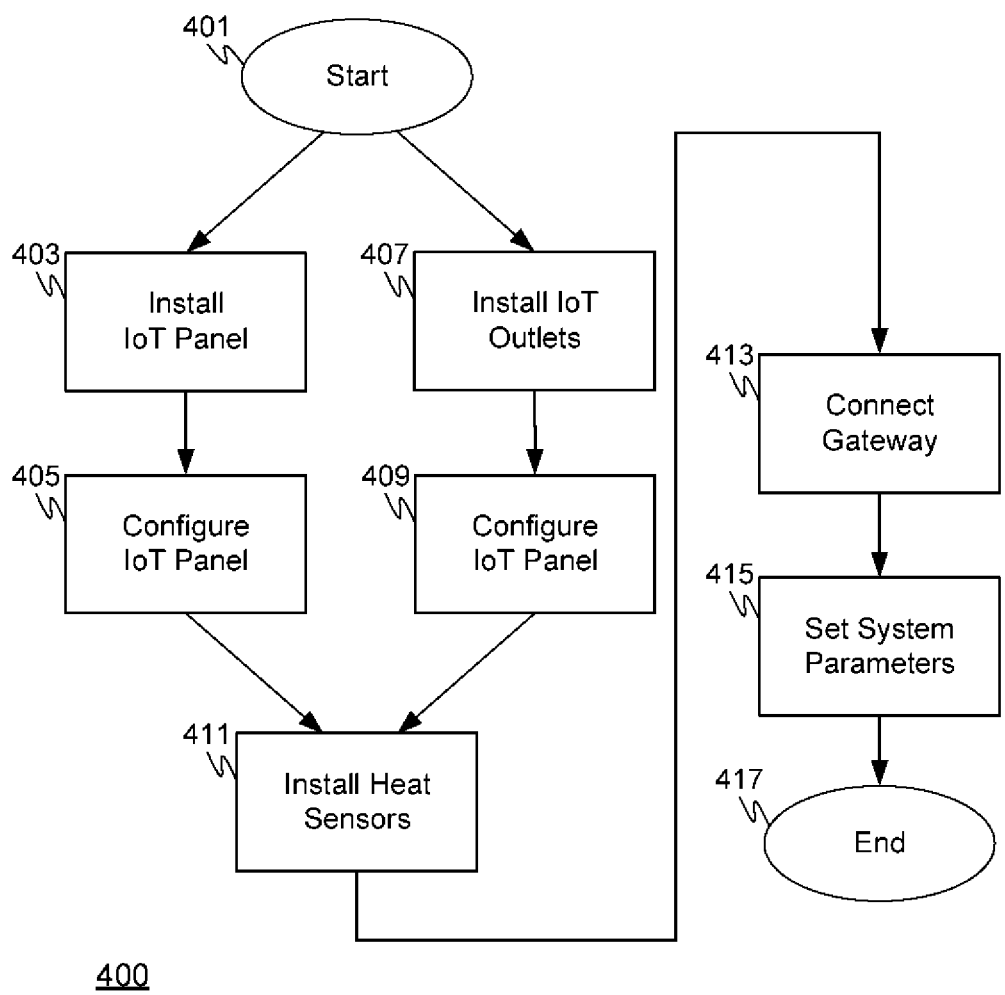
FIGS. 4A-B depict flowchart of steps for setting up the system and practicing methods according to various embodiments disclosed herein.

FIG. 4A depicts a flowchart of method steps for setting up a LAN cable monitoring system according to various embodiments disclosed herein. The method begins at block 401 and proceeds to either 403 or 407, depending upon whether an IoT panel or an IoT outlet is to be installed. Tor configuring an IoT panel—for example, the IoT panel 201 depicted in FIG. 2—the method proceeds to block 403. The IoT panel may be installed by physically attaching it to the rack that houses the network switch to which the IoT panel will be coupled. If there is no rack, or if there is no room on an existing rack, the IoT panel may be positioned proximate the network switch so as to allow routing the network switch cables to the IoT panel. The IoT panel is installed in-line on the signal lines coming out of the network switch. Once the IoT panel is installed in place and the network switch cable are attached to it the method proceeds to block 405. The control parameters may be programmed into the IoT panel to specify communications options for system warnings, setting the temperature limits, specifying the current limits, setting up the software options, and providing other directions and programming for controlling and running the LAN cable monitoring system. Back in block 401 if one or more IoT outlets are to be installed the method proceeds to block 407 instead of block 403. The IoT outlets are typically installed in same locations as conventional RJ45 outlet jacks of the LAN. Once the IoT outlets are installed the method proceeds to 409 to configure the IoT jacks in a manner similar to the configuration of the IoT panel described above. Once the control parameters have been entered into either the IoT panel of the IoT jacks the method proceeds to block 411.

In block 411 the heat sensors are installed. Typically heat sensors are installed along the cable conductor lines. But they may be installed at any point deemed like to indicate a temperature related issue. For example, a heat sensor could be installed on the outside of the network switch box, on file hangars or bracketing hardware for cable bundles or even within an air conditioning duct (to provide early warning of air conditioning failure). Once installation of the heat sensors is completed the method proceeds to block 413 to connect the gateway.

The gateway—for example, gateway 205 of FIG. 2—provides Internet access to the various components of the system. The gateway is typically provisioned with software and/or hardware that communicatively couples the IoT panels and/or the IoT outlets to other software systems, including for example, the Internet, data storage systems, Network Management Systems (NMS), building energy management systems, or the like. Upon completing the connections for the gateway in block 413 the method proceeds to block 415 to set the control parameters and program the system to accomplish the desired operation.

The control parameters may entered directly into the IoT panel or IoT outlets as mentioned above using a smart phone app or other user interface, or may be entered via the gateway. Control parameters help to define the way the system operates. They include communications options for system warnings, predetermined temperature limits for the various sensors, predetermined current limits for the IoT panel(s) and IoT outlets, software options, memory and storage settings and timing settings for the system. The timing parameters include specifying how often current and temperature measurements are taken. The prioritization for cable conductors is also stored among the control parameters. For example, if a cable bundle is detected to have exceeded its heat limit (or current limit), the PoE current constraints won't necessarily be imposed on the largest current using cables in the bundle. A certain cable conductor—say, the cable providing power to the wireless nodes—may be carrying more current than another cable conductor—say, a little used VOIP phone in the basement. However, if the wireless node cable has a higher priority it will remain on and unconstrained while the cable conductor to the VOIP phone has PoE current constraints imposed upon it. The control parameters also specify what data (e.g., current and/or temperature data) is to be stored in memory for later access, and what data is to be used in performing calculations for the block functions. The control parameters may also include the access identifications and verifications indicating who has access to the system and specifying what parts of the system they can access, alter or control. The control parameters may also include any other directions and programming for controlling and running the LAN cable monitoring system. Once the control parameters are set in block 415 the method proceeds to block 417 and ends.

Figure 4B:
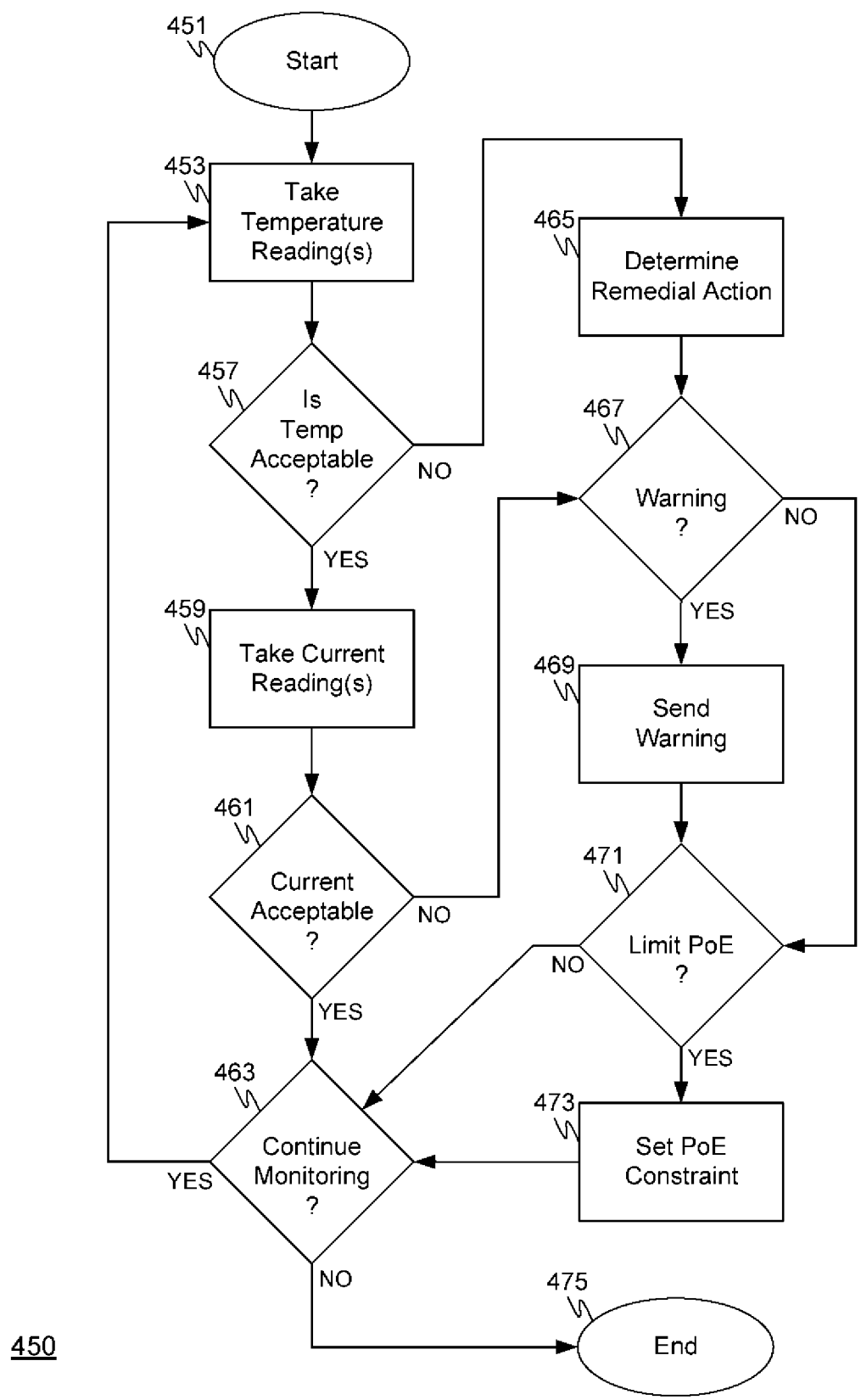

FIG. 4B depicts a flowchart of steps for practicing a method according to various embodiments disclosed herein. The method begins at block 451 and proceeds to block 453 to take the temperature readings. The timing of the temperature readings is controlled by the system, and it may be the case that not all sensors are read at the same time or with the same frequency of readings per day. For example, a sensor on a cable conductor running through an attic may be prone to heating up during the daytime hours, but then is known to cool down to below the interior building temperature during the night hours. Such a sensor could be controlled to be polled for temperature data at one rate during the day—(e.g., once every 10 minutes) and have another slower polling rate at night (e.g., once every 30 minutes). The polling or sampling rate for temperature (or current described below) could be based on whether the reading is getting close to the allowable limit. As the temperature reading get closer to the parameter limit, the polling rate could be automatically sped up so as to avoid going over the limit between measurements.

Upon taking a temperature sensor reading in block 453 the method proceeds to block 457 to determine whether the temperature is within the allowable range. If the temperature exceeds a predetermined temperature parameter limit the method proceeds to block 465 along the "NO" path to determine the remedial action. Depending upon which threshold was exceeded the remedial action may be to either deny port turn up requests for one or more cable conductors in the offending bundle, or to reduce the amount of PoE current of the cables. The cable conductor priority is another determination that is made in block 465. The system parameter settings may be such that the lowest priority conductor cables are constrained first, even before conductor cables that may be carrying more current if they have a higher priority rating. The parameters setting may involve denying port turn up requests for some cables and reducing the PoE current levels for other cables. Once the remedial action is determined and imposed in block 465 the method proceeds to block 467.

Back in block 457 if the temperature reading is within acceptable levels the method proceeds along the "YES" path to block 459. In block 459 the IoT panel or the IoT outlet(s) are controlled to take current readings on one or more cable conductors. Upon taking the current readings the method proceeds to block 461 to determine whether the current is within an acceptable level. If the current exceeds a predefined limit the method proceeds from block 461 along the "NO" path to block 467. In block 467 it is determined whether a warning will be sent out or not, and if so, to whom the warning will be sent. The system parameters (described above in conjunction with block 413 of FIG. 4A) determine who will receive various system warning. The system parameters can be set up to send a system warning to one or more system administrators, technicians or managers. The system parameters may also be set up to send a warning to the device itself. For example, it could be the case that a cable conductor to a VOIP phone near a user's computer is running through a bundle that is overheating. A warning could be sent to the user's computer informing the user that the VOIP phone will be turned off within a given time frame—e.g., in 10 minutes. Sending a warning such as this could give the user a chance to respond, for example, by clicking on a link within the warning and indicating that the VOIP phone to be turned off is needed for a given time period. If, in block 467 it is determined that a warning is to be sent the method proceeds along the "YES" path to block 469 to send the warning, and then on to block 471. However, if no warning is to be sent the method proceeds along the "NO" path to block 471.

In block 471 it is determined whether a PoE current constraint is to be imposed. The current limit may either be in the form of denying any subsequent port turn up requests for a given set of cables, or may be the harsher current constraint of reducing the existing level of allowed current flow for one or more cable conductors. The affected cable conductor(s) may be determined based on the entered priority of the cable conductors, current usage, the time of the day, responses to any warnings that may have been sent, or other factors as are known by those of ordinary skill in the art. If, based on the various factors and control parameter setting, it is determined in block 471 that a PoE current constrain is to be imposed, the method proceeds along the "YES" path to block 473. In block 473 the appropriate constraint is imposed on the indicated cable conductors. The method proceeds from block 473 to block 463.

In block 463 it is determined whether the monitoring and current and/temperature readings are to continue. It may be the case that a system administrator is shutting down the system to implement a software upgrade or replace a hardware module. In such a situation the method proceeds along the "NO" path to block 475 to cease all monitoring and parameter readings. However, if it is determined in block 463 that the monitoring is to continue the method loops back along the "YES" path to block 453 for further polling of temperature and/or current measurements.

The internal memory 513 may include one or more of random access memory (RAM) devices such as synchronous dynamic random access memories (SDRAM), double data rate (DDR) memories, or other volatile random access memories. The internal memory 513 may also include non-volatile memories such as electrically erasable/programmable read-only memory (EEPROM), NAND flash memory, NOR flash memory, programmable read-only memory (PROM), read-only memory (ROM), battery backed-up RAM, or other non-volatile memories. In some embodiments, the computer system 500 may also include $3^{rd}$ level cache memory or a combination of these or other like types of circuitry configured to store information in a retrievable format. In some implementations the internal memory 513 may be configured as part of the processor 501, or alternatively, may be configured separate from it but within the same package 510. The processor 501 may be able to access internal memory 513 via a different bus or control lines than is used to access the other components of computer system 500.

The computer system 500 may also include, or have access to, one or more hard drives 515 (or other types of storage memory) and optical disk drives 517. Hard drives 515 and the optical disks for optical disk drives 517 are examples of machine readable (also called computer readable) mediums suitable for storing the final or interim results of the various embodiments. The optical disk drives 517 may include a combination of several disc drives of various formats that can read and/or write to removable storage media (e.g., CD-R, CD-RW, DVD, DVD-R, DVD-W, DVD-RW, HD-DVD, Blu-Ray, and the like). Other forms or computer readable media that may be included in some embodiments of computer system 500 include, but are not limited to, floppy disk drives, 9-track tape drives, tape cartridge drives, solid-state drives, cassette tape recorders, paper tape readers, bubble memory devices, magnetic strip readers, punch card readers or any other type or computer useable or machine readable storage medium.

The computer system 500 may either include the hard drives 515 and optical disk drives 517 as an integral part of the computer system 500 (e.g., within the same cabinet or enclosure and/or using the same power supply), as connected peripherals, or may access the hard drives 515 and optical disk drives 515 over a network, or a combination of these. The hard drive 515 often includes a rotating magnetic medium configured for the storage and retrieval of data, computer programs or other information. In some embodiments, the hard drive 515 may be a solid state drive using semiconductor memories. In other embodiments, some other type of computer useable medium may be used. The hard drive 515 need not necessarily be contained within the computer system 500. For example, in some embodiments the hard drive 515 may be server storage space within a network that is accessible to the computer system 500 for the storage and retrieval of data, computer programs or other information. In some instances the computer system 500 may use storage space at a server storage farm, or like type of storage facility, that is accessible by the Internet 599 or other communications lines. The hard drive 515 is often used to store the software, instructions and programs executed by the computer system 500, including for example, all or parts of the computer application program for carrying out activities of the various embodiments.

The communication link 509 may be used to access the contents of the hard drives 515 and optical disk drives 517. The communication links 509 may be point-to-point links such as Serial Advanced Technology Attachment (SATA) or a bus type connection such as Parallel Advanced Technology Attachment (PATA) or Small Computer System Interface (SCSI), a daisy chained topology such as IEEE-1394, a link supporting various topologies such as Fibre Channel, or any other computer communication protocol, standard or proprietary, that may be used for communication to computer readable medium. The memory/bus controller may also provide other I/O communication links 509. In some embodiments, the links 509 may be a shared bus architecture such as peripheral component interface (PCI), microchannel, industry standard architecture (ISA) bus, extended industry standard architecture (EISA) bus, VERSAmoduleEurocard (VME) bus, or any other shared computer bus. In other embodiments, the links 509 may be a point-to-point link such as PCI-Express, HyperTransport, or any other point-to-point I/O link. Various I/O devices may be configured as a part of the computer system 500.

In many embodiments, a network interface 519 may be included to allow the computer system 500 to connect to a network 527 or 531. Either of the networks 527 and 531 may operate in accordance with standards for an IEEE 802.3 ethernet network, an IEEE 802.11 Wi-Fi wireless network, or any other type of computer network including, but not limited to, LANs, WAN, personal area networks (PAN), wired networks, radio frequency networks, powerline networks, and optical networks. A network gateway 533 or router, which may be a separate component from the computer system 500 or may be included as an integral part of the computer system 500, may be connected to the networks 527 and/or 531 to allow the computer system 500 to communicate with the Internet 599 over an internet connection such as an asymmetric digital subscriber line (ADSL), data over cable service interface specification (DOCSIS) link, T1 or other internet connection mechanism. In other embodiments, the computer system 500 may have a direct connection to the Internet 599. The computer system 500 may be connected to one or more other computers such as desktop computer 541 or laptop computer 543 via the Internet 599, an intranet 531, and/or a wireless node 545. In some embodiments, an expansion slot 521 may be included to allow a user to add additional functionality to the computer system 500.

The computer system 500 may include an I/O controller 523 providing access to external communication interfaces such as universal serial bus (USB) connections, serial ports such as RS-232, parallel ports, audio in and audio out connections, the high performance serial bus IEEE-1394 and/or other communication links. These connections may also have separate circuitry in some embodiments, or may be connected through a bridge to another computer communication link provided by the I/O controller 523. A graphics controller 525 may also be provided to allow applications running on the processor 501 to display information to a user. The graphics controller 525 may output video through a video port that may utilize a standard or proprietary format such as an analog video graphic array (VGA) connection, a digital video interface (DVI), a digital high definition multimedia interface (HDMI) connection, or any other video connection. The video connection may connect to display 537 to present the video information to the user.

The display 537 may be any of several types of displays or computer monitors, including a liquid crystal display (LCD), a cathode ray tube (CRT) monitor, on organic light emitting diode (OLED) array, or other type of display suitable for displaying information for the user. The display 537 may include one or more light emitting diode (LED) indicator lights, or other such display devices. Typically, the computer system 500 includes one or more user input/output (I/O) devices such as a keyboard and mouse 539, and/or other means of controlling the cursor represented including but not limited to a touchscreen, touchpad, joystick, trackball, tablet, or other device. The user I/O devices 535 may connect to the computer system 500 using USB interfaces or other connections such as RS-232, PS/2 connector or other interfaces. Various embodiments include input devices configured to accept an input from a user and/or provide an output to a user. For example, some embodiments may include a webcam (e.g., connect via USB), a microphone (e.g., connected to an audio input connection), and/or speakers (e.g., connected to an audio output connection). The computer system 500 typically has a keyboard and mouse 539, a monitor 537, and may be configured to include speakers, microphone, and a webcam. These input/output devices may be used in various combinations, or separately, as means for presenting information to the user and/or receiving information and other inputs from a user to be used in carrying out various programs and calculations. Speech recognition software may be used in conjunction with the microphone to receive and interpret user speech commands.

The processor 501 may be embodied as a microprocessor, microcontroller, DSP, RISC processor, two or more parallel processors, or any other type of processing unit that one of ordinary skill would recognize as being capable of performing or controlling the functions, steps, activities and methods described herein. A processing unit in accordance with at least one of the various embodiments can operate computer software programs stored (embodied) on computer-readable medium such those compatible with the disk drives 515, the optical disk drive 517 or any other type of hard disk drive, floppy disk, flash memory, ram, or other computer readable medium as recognized by those of ordinary skill in the art.

As will be appreciated by those of ordinary skill in the art, aspects of the various embodiments may be embodied as a system, method or computer program product. Accordingly, aspects of the present invention may take the form of an entirely hardware embodiment, an entirely software embodiment (including firmware, resident software, micro-code, or the like) or an embodiment combining software and hardware aspects that may all generally be referred to herein as a "circuit," "module," "logic" or "system." Furthermore, aspects of the various embodiments may take the form of a computer program product embodied in one or more computer readable medium(s) having computer readable program code stored thereon.

Any combination of one or more computer readable medium(s) may be utilized. The computer readable medium is typically a non-transitory computer readable storage medium. Such a non-transitory computer readable storage medium may be embodied as, for example, an electronic, magnetic, optical, electromagnetic, infrared, or semiconductor system, apparatus, or device, or other like storage devices known to those of ordinary skill in the art, or any suitable combination of the foregoing. Examples of such computer readable storage medium include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations and aspects of the various embodiments may be written in any combination of one or more programming languages, including an object oriented programming language such as Java, Smalltalk, C++, or the like, and conventional procedural programming languages, such as the "C" programming language or similar programming languages. In accordance with various implementations, the program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus, systems, and computer program products according to various embodiments disclosed herein. It will be understood that one or more blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, a programmable data processing apparatus, or other such devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Various embodiments disclosed herein are drawn to a LAN cable monitoring system. The system may also be called a cable conductor monitoring system, or may be called a communication cable monitoring system, or may be called a LAN cable conductor energy measurement, monitoring and management system. A PoE system typically uses RJ45 connectors. It is understood, however, that the various embodiments may use, or be used with, any number of different types of networks based on various standards known to those of ordinary skill in the art. A "network switch" as this term is used herein is a computer networking device that connects devices together on a computer network, for example, by using packet switching to receive, process, and forward data to the destination device. A network switch may also be called a switching hub, a bridging hub or a MAC bridge. An embodiment of the IoT outlet is disclosed as being Ethernet wall plate RJ45 socket outlet. The IoT outlet may be embodied as other like types of outlets conforming to various other electronics and/or connector standards known to those of ordinary skill in the art. A temperature sensor positioned either directly on (e.g., fastened to) or in physical contact with a cable conductor (or the outside insulator of a cable conductor line) may be said to measure a temperature of the cable conductor.

A first plurality of items each "respectively connected" to a second plurality of items means that each item in the first plurality of items is connected to one of the items in the second plurality of items. The two components that are "communicatively coupled" as this term is used herein means that the two components are in communication with each other. The components need not have a constant communication connection at all times to be communicatively coupled. For example, two components—e.g., an IoT panel of a temperature sensor—may be communicatively coupled via the Internet. They are considered communicatively coupled even though their Internet access may not afford them constant contact with each other at all times, 24 hours per day. An first term connected to second item may either be communicatively coupled, or may be hardwired or to provide a constant connection. The IoT panel is illustrated in FIG. 2 and described as being connected to a network switch with a number of cable connectors. However, in some implementations either all or a subset of the IoT panel circuitry or functionality may be enclosed within the network switch itself. Cable conductors are considered to be "bundled together" or in a "bundle" if they are fastened together with a tie strap, tied together, or taped together, or otherwise are positioned in physical contact with each other.

The description of the various embodiments provided above is illustrative in nature inasmuch as it is not intended to limit the invention, its application, or uses. Thus, variations that do not depart from the intents or purposes of the invention are intended to be encompassed by the various embodiments of the present invention. Such variations are not to be regarded as a departure from the intended scope of the present invention.

What is claimed is:

1. A cable conductor monitoring system:
    an IoT device including an IoT input port configured to be connected to a network switch output port;
    a plurality of IoT input ports on the IoT device comprising said IoT input port, each of the plurality of IoT input ports configured to be respectively connected to one of a plurality of network switch output ports including said network switch output port;
    an IoT output port of the IoT device configured to be connected to a cable conductor, the cable conductor being one among a plurality of cable conductors bundled together;
    a plurality of IoT output ports on the IoT device comprising said IoT output port, each of the plurality of cable conductors being respectively connected to one of the plurality of IoT output ports on the IoT device;
    a sensor communicatively coupled to the IoT device and configured to take a parameter reading of the cable conductor; and
    a memory configured to store parameter reading;
    wherein the IoT device is configured to receive a control signal imposing a current constraint on one or more cable conductors of the plurality of cable conductors, the current constraint being based on said parameter reading; and
    wherein the plurality of cable conductors are each connected to the network switch via the IoT device.

2. The cable conductor monitoring system of claim 1, wherein the memory is configured to store a parameter limit; and
   wherein the current constraint is denial of port turn up requests from the network switch for the one or more cable conductors based on the parameter reading exceeding the parameter limit.

3. The cable conductor monitoring system of claim 1, further comprising:
   a gateway communicatively coupled to the IoT device;
   wherein the gateway is configured to provide Internet access to the IoT device;
   wherein the IoT device is an IoT panel; and
   wherein the memory is within the IoT device.

4. The cable conductor monitoring system of claim 1, wherein the sensor is a temperature sensor and the parameter reading is a temperature measurement, the cable conductor monitoring system further comprising:
   a plurality of temperature sensors comprising said temperature sensor, each of the plurality of temperature sensors being positioned at a different point on respective ones of the plurality of cable conductors.

5. The cable conductor monitoring system of claim 4, wherein the memory is configured to store a first temperature limit and a second temperature limit greater than the first temperature limit; and
   wherein the current constraint comprises a reduction of current allowed on at least one of said one or more cable conductors based on the temperature measurement exceeding the second temperature limit.

6. The cable conductor monitoring system of claim 1,
   wherein the sensor is a current sensor and the parameter reading is a current measurement;
   wherein the current sensor is configured to make the current measurement of current passing through the IoT input port connected to the network switch.

7. The cable conductor monitoring system of claim 6, wherein the current sensor is a first current sensor, the cable conductor monitoring system further comprising:
   a plurality of current sensors including the first current sensor and a second current sensor, each of the plurality of current sensors being positioned to measure current passing through a different respective one of the plurality of cable conductors.

8. The cable conductor monitoring system of claim 1, wherein the IoT device is an IoT outlet.

9. The cable conductor monitoring system of claim 1, wherein the current constraint turns off one or more IoT output ports of the plurality of IoT output ports.

10. The cable conductor monitoring system of claim 1, wherein the current constraint is a first current limit;
    wherein the memory is configured to store a parameter limit and a second current limit different from the first current limit; and
    wherein the IoT device imposes the second current limit on at least one of said one or more cable conductors based on the parameter reading exceeding the parameter limit.

11. The cable conductor monitoring system of claim 1, further comprising:
    a plurality of IoT outlets connected to the network switch including a first IoT outlet and a second IoT outlet.

12. A method of monitoring cable conductors comprising:
    connecting an IoT device including an IoT input port to a network switch output port;
    providing a plurality of IoT input ports on the IoT device;
    connecting each of the plurality of IoT input ports to a respective one of a plurality of network switch output ports;
    connecting an IoT output port of the IoT device to a cable conductor, the cable conductor being one among a plurality of cable conductors bundled together;
    providing a plurality of IoT output ports on the IoT device;
    connecting each of the plurality of cable conductors to a respective one of the plurality of IoT output ports on the IoT device, wherein said IoT output port is configured to be connected to the cable conductor;
    positioning a sensor on the cable conductor, the sensor being communicatively coupled to the IoT device and configured to take a parameter reading of the cable conductor;
    storing the parameter reading in a memory within the IoT device;
    sending a control signal to the IoT device imposing a current constraint on one or more cable conductors of the plurality of cable conductors, the current constraint being based on said parameter reading;
    wherein the plurality of cable conductors are each connected to the network switch via the IoT device.

13. The method of monitoring cable conductors of claim 12, further comprising:
    configuring the memory to store a parameter limit; and
    wherein the current constraint is denial of port turn up requests from the network switch for the one or more cable conductors based on the parameter reading exceeding the parameter limit.

14. The method of monitoring cable conductors of claim 12, further comprising:
    communicatively coupling a gateway to the IoT device;
    wherein the gateway is configured to provide Internet access to the IoT device;
    wherein the IoT device is an IoT panel; and
    wherein the memory is within the IoT device.

15. The method of monitoring cable conductors of claim 12, wherein the sensor is a temperature sensor and the parameter reading is a temperature measurement, the method further comprising:
    providing a plurality of temperature sensors comprising said temperature sensor; and
    positioning each of the plurality of temperature sensors at a different point on the plurality of cable conductors.

16. The method of monitoring cable conductors of claim 15, further comprising:
    configuring the memory to store a first temperature limit and a second temperature limit greater than the first temperature limit; and
    imposing a reduction of current allowed on at least one of said one or more cable conductors based on the temperature measurement exceeding the second temperature limit.

17. The method of monitoring cable conductors of claim 12, wherein the sensor is a current sensor and the parameter reading is a current measurement, the method comprising:
    configuring the current sensor to make the current measurement of current passing through the IoT input port connected to the network switch.

18. The method of monitoring cable conductors of claim 17, wherein the current sensor is a first current sensor, the method further comprising:
    providing a plurality of current sensors including the first current sensor and a second current sensor; and positioning each of the plurality of current sensors to measure current passing through a different respective one of the plurality of cable conductors.

19. The method of monitoring cable conductors of claim 12, wherein the IoT device is an IoT outlet.

20. The method of monitoring cable conductors of claim 12, wherein the current constraint turns off one or more IoT output ports of the plurality of IoT output ports.

21. The method of monitoring cable conductors of claim 12, wherein the current constraint is a first current limit, the method further comprising:

configuring the memory to store a parameter limit and a second current limit different from the first current limit; and imposing the second current limit on at least one of said one or more cable conductors based on the parameter reading exceeding the parameter limit.

22. The method of monitoring cable conductors of claim 12, further comprising:

connecting a plurality of IoT outlets to the network switch including a first IoT outlet and a second IoT outlet.

* * * * *